May 1, 1956 R. W. GILBERT 2,744,168

D. C. AMPLIFIER

Filed Jan. 21, 1952

ROSWELL W. GILBERT

INVENTOR.

BY

Gaylor, Cifelli & Janick

ATTORNEYS

United States Patent Office 2,744,168

Patented May 1, 1956

2,744,168

D. C. AMPLIFIER

Roswell W. Gilbert, Montclair, N. J., assignor to Weston Electrical Instrument Corporation, Newark, N. J., a corporation of New Jersey Application January 21, 1952, Serial No. 267,463

3 Claims. (Cl. 179—171)

This invention relates to electrical amplifiers and more particularly to a novel D.-C. amplifier operating on a frequency-shift principle, together with a feedback system, and which offers unique performance advantages.

It is known that the most effective method of sensitive D.-C. amplification, for measurement purposes, is preliminary conversion to A.-C. In practice, the resolution of an A.-C. amplifier is limited only by the fundamental noise levels, and conductive de-coupling permits of greater circuit flexibility for feedback purposes. As a class, systems comprising a network loop of error conversion, amplification, phased rectification and degenerative feedback to cancel the error, are extensively used in many effective devices for D.-C. amplification as a process of measurement. The performance of such systems largely is contingent upon the detailed characteristics of the sensitive converter and considerable developmental effort has been expended to produce the several methods and devices in present use such as for example, the contact modulator and the thermally-modulated resistance. In some cases characteristic gain is obtained as in the saturable reactor amplifier, certain non-linear resistance element circuits, and impedance modulators such as the capacitance modulator.

The choice of a specific system or apparatus is determined by details of the particular requirements, but in general the following functional objectives are sought in apparatus of this class.

1. The conversion gain should be sufficiently low to maintain an adequate feedback ratio.

2. The converting device should not introduce spurious components additive to the input level.

3. The converting device should not be subject to excessive drift in terms of input level.

4. The frequency of conversion should be sufficiently high for high speed resolution.

Present devices are most deficient in the fourth objective, above. In closed feedback systems the feedback period must be made relatively long with respect to the periodicity of converter modulation in order to avoid oscillation around the loop or a step-function response. In such case the overall system, then, will have a phase velocity insufficient for many requirements, or will be objectionable in applications where complicating corrective measures are inadmissible.

My novel system, to be described herein, comprises a sensitive D.-C. to A.-C. converter having the advantage of high operating frequency, into the megacycle region if desired. With suitable amplification, reasonably peaked to the operating frequency, feedback periods of the order of milliseconds are readily obtainable. The system has an inherently high conversion gain, of the order of $10^8$ on an energy basis, and delivers a high amplifier input level. The components and attendant circuitry are simple and economical.

An object of this invention is the provision of a closed-feedback, D.-C. amplifier system utilizing a sensitive instrument type D.-C. to A.-C. converter.

An object of this invention is the provision of a sensitive D.-C. amplifier comprising a pivoted movable coil deflectable in a composite constant and varying magnetic flux field, a coil carrying current of a given operating frequency for producing the varying flux field, means responsive to changes in the said operating frequency brought about by a deflection of the said movable coil from its normal, zero-center position, a balanced type discriminator responsive to the change in operating frequency to produce a D.-C. output that varies in sense and magnitude in accordance with the deflection of the said movable coil to one side or the other of its normal, zero-center position, and circuit elements for introducing a portion of the discriminator output into the said movable coil in a degenerative sense.

These and other objects and advantages will become apparent from the following description when taken with the accompanying drawings illustrating the invention. It will be understood the drawings are for purposes of illustration only and are not to be construed as defining the scope or limits of the invention, reference being had for the latter purpose to the appended claims.

In the drawings wherein like reference characters denote like parts in the several views.

Figure 1:
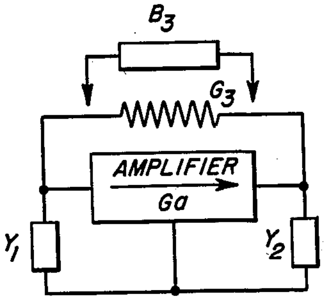
Figure 1 is a block diagram showing an idealized amplifier including a feedback loop.

Reference is now made to Figure 1 which is a block diagram of an idealized amplifier having a transconductance ($G_a$), of positive sign, coupled back upon itself by a pie network comprising an output admittance $Y_2$, and input admittance $Y_1$ and a feedback conductance $G_3$. Such a system will oscillate when the amplifier transconductance is larger than the real component of the feedback admittance. The general admittance of the loop may be stated as:

$$G_a - \frac{Y_1Y_2 + Y_1G_3 + Y_2G_3}{G_3} = 0 \qquad (1)$$

which must have a real solution for oscillation. In practical amplifiers the transconductance is amplitude-limited by the energy output of the amplifier, so a solution can develop by an amplitude reduction of $G_a$ provided the phase solution is real, which requires some frequency where the feedback network is entirely conductive. Thus the system, if capable, will oscillate at a frequency ($f_0$) where the coupling network has a zero phase angle, and at an amplitude of oscillation where $G_a$ is reduced to equality with the transfer conductance of the coupling network.

When the input and output admittances are large with respect to the feedback conductance, as is permitted when $G_a$ is of a usual order, Expression 1 may be approximated as:

$$G_a - \frac{Y_1Y_2}{G_3} = 0 \qquad (2)$$

Now consider the addition of a susceptive feedback element $B_3$ in parallel with the original feedback conductance $G_3$. The simplified impedance Expression 2 now becomes:

$$G_a - \frac{Y_1 Y_2}{G_3 + B_3} = 0 \qquad (3)$$

The frequency of oscillation will now shift to a frequency where the input and output admittances will have a composite phase angle opposing that introduced by $B_3$, and a real solution demands that:

$$\angle(Y_1 Y_2) = \angle(G_3 + B_3) \qquad (4)$$

to keep the coupling network phaseless in order to match the phaseless amplifier transconductance $G_a$.

$Y_1$ and $Y_2$ are parallel L-C circuits phase-resonant at $f_0$, and the frequency shifts in response to an appearance of $B_3$ in a direction and to a degree proportional to the sign and magnitude of $B_3$ respectively.

Figure 2:
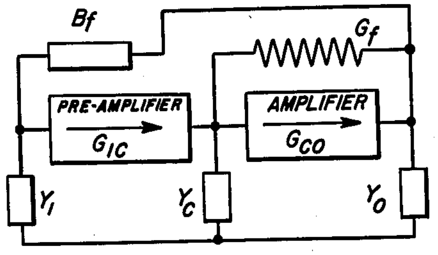
Figure 2 is an extension of the Figure 1 illustration.

Figure 2 differs essentially from the explanatory circuit of Figure 1 in the addition of the preamplifier section $G_{ic}$ effective upon feedback through the galvanometer coupling parameter, here $B_f$. This increases the sensitivity of the system to $B_f$ without requiring an impractical low value of conductive feedback, here $G_f$, for maintenance of oscillation. When $B_f$ is zero the preamplifier section is quiescent, but the second amplifier section is in stable oscillation. $Y_i$, $Y_c$ and $Y_o$ are the input, interstage coupling, and output admittances respectively.

The general simplified impedance of the loop now is:

$$G_{eo} - \frac{Y_i Y_c Y_o}{G_{ic} B_f + G_f Y_i} = 0 \qquad (5)$$

which is similar to that for the illustrative circuit, Expression 3. The output section transconductance $G_{co}$ is amplitude limited as before, but the input section transconductance $G_{ic}$ is normally constant because of the low input level. Note that when $B_f$ is zero the expression neglects $G_{ic}$, but is much more sensitive to appearance of $B_f$ because of the gain of the input section $G_{ic}$.

To complete the amplifying system the output admittance $Y_o$ includes a frequency discrimination rectifier to supply the output D.-C. in response to the frequency shift, as will be described hereinbelow.

The sensitive D.-C. to A.-C. converter employed in my novel system comprises an induction galvanometer. The operation of such galvanometer is described in my United States Patent No. 2,486,641, issued November 1, 1949, and entitled "Measuring and Control Apparatus" and a prefered construction of such device is described in my pending United States patent application Serial No. 108,812, filed August 5, 1949, now Patent No. 2,650,348, issued August 25, 1953, entitled "Induction Galvanometer." For present purposes it is deemed sufficient to describe a functional construction of the device.

Figures 3, 4:
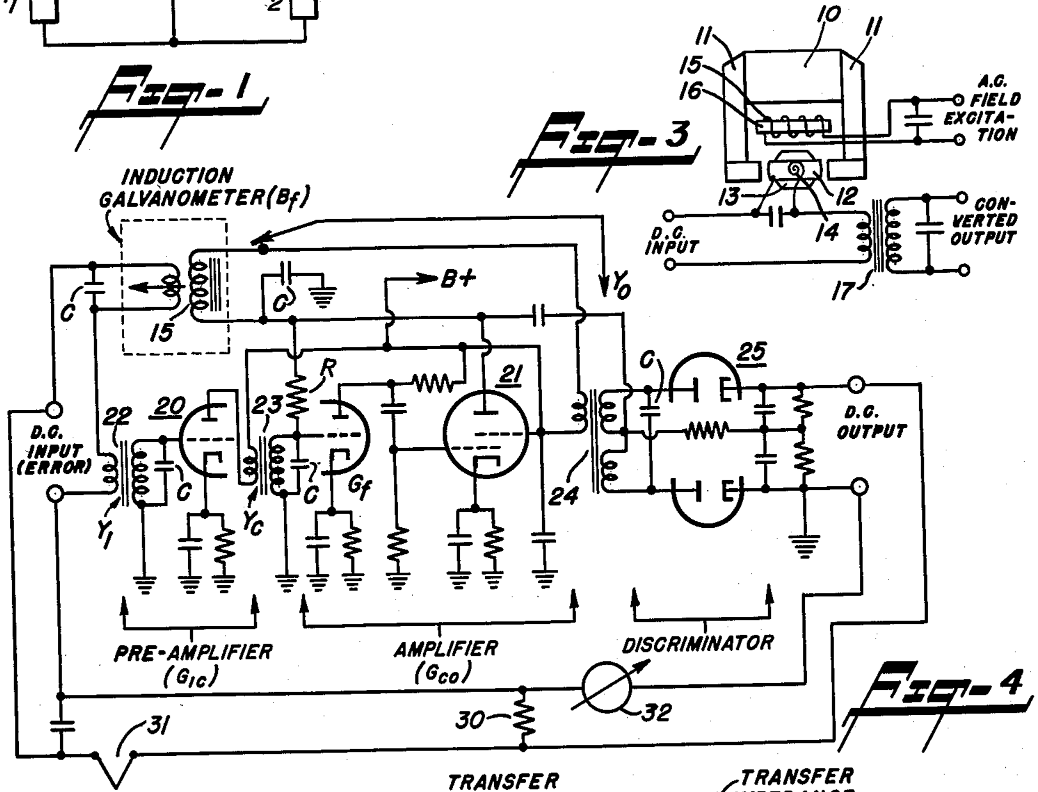
Figure 3 is a diagrammatic representation of the sensitive D.-C. to A.-C. converter.
Figure 4 is a circuit diagram of a complete apparatus made in accordance with this invention.

Reference is now made to Figure 3 illustrating the induction galvanometer which, essentially, is a permanent magnet, movable coil instrument structure but including means for injecting an A.-C. component of magnetic flux into the permanent field flux path. The normal, constant magnetic flux is provided by a permanent magnet 10 having soft-iron pole pieces 11 attached thereto. A wire-wound movable coil 12 is pivotally mounted for rotation about a soft-iron core 13, current being brought to the movable coil by means of conventional hair springs (the upper such spring 14 being visible in the drawing). Thus, when D.-C. current flows through the movable coil it will rotate in a direction and to an extent depending upon the direction and magnitude of the D.-C. current flowing therein. The varying magnetic flux field is produced by a coil 15 encircling a core 16, said coil being energized by an appropriate high-frequency current. It will be apparent that the movable coil 12 rotates in a magnetic flux gap that includes the steady flux field of the permanent magnet 10 and the varying flux field produced by the coil 15. When the movable coil is in its normal, zero-center position, as shown in the drawing, the A.-C. field flux linkage is zero. However, deflection of the coil 12 causes the coil to proportionally link the A.-C. component of field flux, and an A.-C. component of potential having a magnitude and phase-direction proportional to the degree and direction of deflection is induced in the coil. Thus, deflection of the coil in response to a D.-C. current will produce an A.-C. potential which can be extracted by the external circuit for amplification as, for example, by means of the transformer 17.

Of necessity, the connected external circuit presents an effective A.-C. impedance across the coil, and an A.-C. component of current will circulate through the coil causing a force reaction with the A.-C. component of field flux. The induced potential is in quadrature with the field flux, and if the coil circuit is entirely resistive the A.-C. current will likewise be in quadrature and the reaction force will be entirely alternating. However, reactance in the coil circuit impedance will develop an inphase component of coil current, and the coil will be subjected to a steady-state component of parasitic torque, which must be minimized. The torque appears as mechanical stiffness, similar to that imposed by a mechanical spring, but may be of either sign, positive or negative when the coil circuit is inductive or capacitive, respectively. It is, therefore, essential that the phase angle of the coil and the connected circuit be considered.

Actually the reaction torque effect is useful because the coil circuit can include a resonated transformer which can be trimmed to cancel the torque of the filaments required for conductive connection to the coil. Transformer tuning thus serves as an adjustment to the point of infinite sensitivity by virtue of an infinite net mechanical compliance, or as close an approach as practical permanency of adjustment will permit.

The developed A.-C. coil potential is directly proportional to frequency, whereas the reaction force is a current-flux product. Thus for a constant conversion sensitivity the A.-C. flux level may be reduced by raising the operating frequency, and the torque effect reduced in proportion. In fact, the operational quality of the device is proportional to increasing frequency until limited by some secondary consideration such as losses in the field structure or the movable coil.

The solid iron flux paths normally used in D.-C. instrument structures are not efficient for the high-frequency component of flux, and conversely magnetic materials good at high frequencies have permeabilities insufficient for the relatively high level of steady flux from the permanent magnet. It is thus necessary to have a composite magnetic structure including materials individually efficient for both components of the field flux. Such pole structure is disclosed in my above-referenced co-pending application.

In the operating circuit, to be described with reference to Figure 4, both the movable coil and the A.-C. field coil of the galvanometer are individually resonated to the operating frequency, and for small coil deflections the quadrature phase-shift, characteristic of loosely-coupled resonant circuits, obtains. Thus, the movable coil output appears in quadrature to the excitation field, which permits the frequency-shift operating circuit to be described below.

It may here be pointed out that the induction galvanometer offers design and performance optimums not usual to D.-C. instrument mechanisms. For example:

1. The small deflection angle allows concentration of the permanent magnetic field to a high density.

2. The movable coil carries no load such as a pointer or mirror, allowing an unusually light coil design having a low moment of inertia.

3. The alternating component of torque reduces friction to an undetectable order, allowing pivot and jewel bearings at sensitivities normally requiring a suspension design.

4. Electrical cancellation of the filament torque provides resolution sensitivity as a function of adjustment rather than as a design limit.

The induction galvanometer is applied in my circuit to effect a frequency shift in the manner of $B_3$, explained with reference to Figure 1. The galvanometer A.-C. field coil is included as part of the output admittance $Y_2$, and the movable coil as part of the input admittance $Y_1$. With both tuned to parallel resonance, and loosely coupled by a small movable coil deflection, the feedback component, due to deflection of the movable coil, will be shifted in quadrature phase and will appear as the susceptive feedback $B_3$. Actually, the equivalent $B_3$ component is zero when the movable coil is at its normal, zero-center position and such component will have a sign and magnitude proportional to the deflection of the movable coil. The conductive element $G_3$ is still necessary to maintain oscillation, but only in sufficient amount to insure stable operation.

In order to obtain a large, useful, D.-C. ouput in response to a small D.-C. input, the amplifier itself is arranged for degeneration by including a D.-C. feedback path in a degenerative sense. The amplifier then serves as an error-resolver and may function for example as an automatic potentiometer. The error amplifier then need only have a high gain but not necessarily stability, gain producing the necessary stability by the feedback mechanism.

D.-C. degeneration may be applied in many forms familiar to practise, the simplest being a single resistance mutual to the input and output circuits. It may include functions of time integration or differentiation for purposes of damping or for control of response time. It may include motor driven components such as a slide wire combined with reactive elements for damping. But in general the freedom with which various forms and amounts of degeneration may be succcessfully applied is contingent upon a high phase-velocity in the error resolving function; otherwise phase reversals may develop in the operating loop, leading to instability or limiting the designed response speed.

In any event, while the methods of degeneration are too numerous to discuss, a common requirement for high resolution sensitivity and phase velocity dictates the best obtainable performance in these respects for the broadest usage. To this end a practical design applicable to many degenerative systems will be described without reference to any specific method of degeneration or application.

The circuit of the frequency-shift amplifier including the output frequency discriminator, is shown in Figure 4 in which the components corresponding to the equivalent network elements are identified. The pre-amplifier consists of one half of the dual triode 20, and the amplifier section consists of the other half of the dual triode and a power pentode 21, in cascade. Two stages are required in the amplifier section in order to phase the conductive feedback $G_f$ in regenerative sense. Toward this end the feedback resistance R couples the alternating current amplifier output to the input, the value of this resistance being sufficient to cause oscillation of the amplifier. The input transformer 22, the interstage coupling transformer 23 and the discriminator transformer 24, are of conventional cup-core construction and are resonated to a center frequency of 200 kilocycles by the associated capacitors *c*. The bulk of the output impedance is in the field coil 15 of the induction galvanometer and its associated resonating capacitor *c*, with the discriminator transformer 24 coupled by insertion of its primary winding in series with the field coil, as shown. This phases the discriminator properly. Actually, the primary of the discriminator transformer consists of a relatively few turns, the number of turns determining the coefficient of coupling between the separately-resonated galvanometer field circuit and the secondary winding that is connected to the dual diode rectifier 25.

The frequency discriminator is a conventional balanced type as commonly used in radio practice, and is phased by the capacitive connection to the output stage plate. The output D.-C. is thus balanced at center frequency and polarized with respect to frequency-shift as the galvanometer deflects. As a power output element it is reasonably efficient, particularly when designed for supplying high-impedance load circuits.

It is pointed out that the galvanometer field and the discriminator transformer secondary are separately tuned to the same center frequency and coupled. The coupling co-efficient may then be selected to slightly overcouple the two resonant circuits, to develope a double peaked impedance and phase characteristic identified with the overcoupled condition. In the operating loop this compound impedance appears in shunt to the single-peak impedance of the interstage transformer, and by proper adjustment of the Q factors of the circuits in relation to the coupling coefficient an overall flat-topped impedance and phase characteristic may be developed.

A flat-topped phase characteristic of the overall total shunt impedance requires a relatively large excursion of frequency to produce a minor order of phase angle for balance against the feedback through $B_f$, and a correspondingly small appearance of $B_f$ causes a large frequency shift. Theoretically a truly flat top would make the system infinitely sensitive to $B_f$.

Overcoupling in proper amount thereby provides a method of simple adjustment to any desired incremental sensitivity about the center-frequency point, and a relatively high sensitivity over reasonable excursions from center. The system is considerably superior to a conventional amplitude amplifier of similar component complement, unless regenerated for extra gain which is ordinarily not as tractable of adjustment as simple resonant impedances.

Figure 5A:
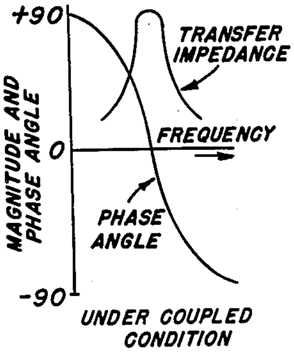
Figures 5A–5C are curves illustrating the influence of coupling upon the transfer characteristic of a network containing coupled, resonant circuits.
Figure 5B:
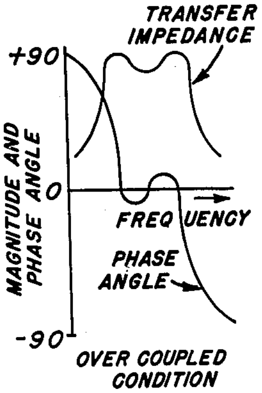
Figure 5C:
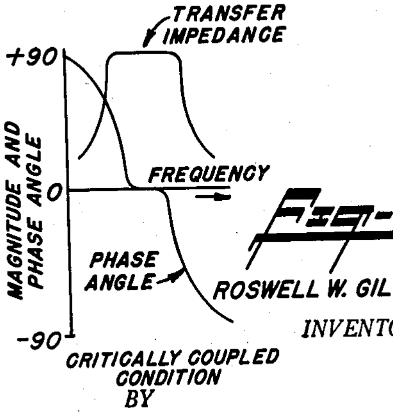

Reference is now made to Figures 5A to 5C which illustrate the nature of the influence of coupling upon the transfer characteristic of a network containing coupled, resonant circuits. Figure 5A shows the undercoupled, or loosely coupled, condition wherein the phase angle goes through zero at the resonant frequency of each of the coupled circuits. Figure 5B shows the overcoupled condition wherein the phase angle goes through zero three times, specifically, at the center resonant frequency of the coupled circuits and at two other frequencies above and below resonance, the latter two points being separated by an amount proportional to the degree of overcoupling. Figure 5C shows the borderline condition between overcoupling and undercoupling and known as critical coupling. It will be noted that in the Figure 5C case the phase angle remains substantially zero over the flat top region of the transfer impedance. This is the ideal condition for operation of my frequency shift system in that the frequency can be shifted over the flat top region with a minimum feedback through the gavanometer coupling parameter ($B_f$).

It would appear that excess overcoupling resulting in double-peaking of the total impedance could cause instability by making the frequency of oscillation jump discontinuously from peak to peak, as commonly occurs in coupled oscillators. However, in use, the system includes a D.-C. degenerative feedback loop which exerts a corrective action. Figure 4 illustrates a simple degenerative feedback loop including the resistor 30 mutual to the amplifier output and input circuits (the latter including, for example the thermocouple 31) and a translating device 32 responsive to the discriminator output. While I show the translating device as an indicating instrument it will be apparent other current-responsive translating means may be utilized. When the system is highly degenerated excess overcoupling may in fact be perfectly stable, and is evidenced by reversal of the balancing action of the galvanometer; in this case the galvanometer exerts restraint upon the frequency shift rather than initiating the shift. Sensitivity in terms of galvanometer deflection is then past infinity and negative. Actually the ideal adjustment condition is to the point of disappearing galvanometer deflection, with ability of the system to accommodate excess overcoupling considered as an adjustment tolerance.

It is difficult to present a concrete analysis of the performance of a system where results are dependent almost entirely upon adjustment. Some adjustment tolerance must be determined as a permanent condition from the standpoint of engineering design, as a basis for evaluation. Upon this basis the following details of performance are offered:

Galvanometer excursion for full output excursion is in the order of 5 seconds of angle. This has not been measurable by direct observation, but determined from the developed coil potential and/or the time-constant of feedback in a degenerated system against the mechanical moment of the coil.

Galvanometer resolution in terms of deflection and spring compliance is by far sufficient to make other limiting conditions, thermal drift for example, the effective limit upon the input sensitivity.

The small mechanical moment of the coil, the short excursion angle and the high phase velocity of the amplifier operating at a high frequency combine to result in a short feedback period. For example, degeneration to an input range of 1 millivolt will result in a feedback period of about 0.1 second under a condition of considerable misadjustment.

When the amplifier is closely adjusted and critically examined, limiting noise due to thermal motion impacts upon the movable coil is observable. This is the generally recognized limit to the sensitivity of galvanometers beyond which amplification involves bandwidth considerations.

The short feedback period is perhaps most useful in providing stability when the feedback circuit is designed for differentiation or integration functions. For example current may be time-integrated by feedback through a capacitor, and potential may be time-integrated by feedback through a mutual inductor. In such cases even short phase delays in the amplifier will lead to overall feedback oscillation around the operating loop.

In feedback systems such as those to which this circuit is applicable it has apparently only been recently appreciated that the sensitivity of error detection may be raised through infinity to function with stability on the negative side. The normal action of initiating control then has become restraint upon a system that spontaneously desires to initiate the change. Stability, whether operation is by initiation or restraint, is a function of the time parameters of the system, and transition through the point of infinite error resolution need include no discontinuous function leading to instability.

Having now described my invention in accordance with the patent statutes what I desire to protect by Letters Patent is set forth in the following claims.

I claim:

1. A direct current amplifier having a direct current input circuit and a direct current output circuit said amplifier comprising a direct current to alternating current converter consisting of a fixed coil and a movable coil inductively coupled to each other, said movable coil operating in a unidirectional magnetic flux field and movable relative to the fixed coil in response to current flowing in the movable coil thereby to vary the degree of inductive coupling between the coils; an alternating current amplifier having input and output circuits, said amplifier including at least one circuit resonant at a predetermined frequency and resistive regenerative feedback means sufficient with respect to the forward gain of such amplifier to cause oscillation thereof at the said predetermined frequency; circuit elements coupling the converter movable coil to the alternating current amplifier input circuit; circuit elements coupling the converter fixed coil to the alternating current amplifier output circuit; circuit elements connecting the converter movable coil to the said direct current input circuit; and frequency discriminating rectifier means responsive to the frequency of oscillation of the alternating current amplifier and connected to the said direct current output circuit; the recited arrangement being such that direct current applied to the said direct current input circuit results in relative movement between the said movable and fixed coils thereby changing the degree of mutual inductive coupling between these coils and producing a corresponding change in the frequency of oscillation of the alternating current amplifier, said discriminator responding to such change in frequency to produce a corresponding change in the direct current output of the direct current amplifier.

2. The invention as recited in claim 1, including a circuit conductively coupling the said direct current output circuit to the said direct current input circuit in degenerative relation with respect to the forward gain of the direct current amplifier.

3. The invention as recited in claim 1, wherein the phase angle of the combined transfer function of the resonant circuits of the alternating current amplifier is substantially constant over the range of oscillation frequency of the alternating current amplifier.

References Cited in the file of this patent

UNITED STATES PATENTS

| | | |
|---|---|---|
| 2,159,775 | Anderson | May 23, 1939 |
| 2,207,540 | Hansell | July 9, 1940 |
| 2,351,353 | McCarty | June 13, 1944 |
| 2,368,701 | Borden | Feb. 6, 1945 |
| 2,486,641 | Gilbert | Nov. 1, 1949 |